US012677404B2

(12) United States Patent
Chen

(10) Patent No.: US 12,677,404 B2
(45) Date of Patent: Jul. 7, 2026

(54) CURRENT SENSOR WITH INVERTED SHIELDING ELEMENT

(71) Applicant: Suzhou Littelfuse OVS Co., Ltd., Suzhou (CN)

(72) Inventor: Tao Chen, Suzhou (CN)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 183 days.

(21) Appl. No.: 18/495,307

(22) Filed: Oct. 26, 2023

(65) Prior Publication Data

US 2024/0147681 A1 May 2, 2024

(30) Foreign Application Priority Data

Oct. 28, 2022 (CN) .......................... 202211336632.6

(51) Int. Cl.
*G01R 15/20* (2006.01)
*H05K 9/00* (2006.01)

(52) U.S. Cl.
CPC ......... *H05K 9/0032* (2013.01); *G01R 15/202* (2013.01); *G01R 15/207* (2013.01)

(58) Field of Classification Search
CPC .... G01R 15/202; G01R 15/207; G01R 19/00; G01R 1/18; H05K 9/0032
See application file for complete search history.

(56) References Cited

U.S. PATENT DOCUMENTS

| 10,948,522 B2 * | 3/2021 | Shimizu | G01R 33/07 |
| 11,067,606 B2 * | 7/2021 | Li | G01R 15/207 |
| 12,055,567 B2 * | 8/2024 | Tamura | G01R 15/207 |
| 2011/0148407 A1 * | 6/2011 | Kawaguchi | G01R 15/207 |
| | | | 324/244 |
| 2015/0260762 A1 * | 9/2015 | Sakamoto | G01R 15/207 |
| | | | 324/117 R |
| 2017/0082659 A1 * | 3/2017 | Harada | G01R 15/20 |
| 2017/0343584 A1 | 11/2017 | Abe | |
| 2020/0064380 A1 | 2/2020 | Li | |
| 2020/0256895 A1 * | 8/2020 | Okuyama | G01R 15/148 |
| 2021/0293858 A1 * | 9/2021 | Takahashi | G01R 15/207 |
| 2022/0244325 A1 * | 8/2022 | Hirano | G01R 15/207 |
| 2023/0111157 A1 * | 4/2023 | Taoka | G01R 15/207 |
| | | | 324/117 R |

(Continued)

FOREIGN PATENT DOCUMENTS

| JP | 201517862 A | 1/2015 |
| JP | 2016145821 A | 8/2016 |
| JP | 2019120687 A | 7/2019 |

(Continued)

OTHER PUBLICATIONS

Extended European Search Report for EP Application No. 23204595.5, dated Apr. 2, 2024, 8 pages.

*Primary Examiner* — Dominic E Hawkins
(74) *Attorney, Agent, or Firm* — KDW Firm PLLC

(57) ABSTRACT

A sensor device may include a substrate within the housing, a sensing element coupled to the substrate, and a shielding element surrounding the sensing element, wherein the shielding element extends through an opening of the substrate. The sensor device may further include a busbar extending through the housing, wherein the shielding element further extends through an indentation along at least one side of the busbar.

12 Claims, 4 Drawing Sheets

(56)                    References Cited

U.S. PATENT DOCUMENTS

2023/0142008 A1 *    5/2023   Sim ..................... G01R 15/207
                                                              324/765.01

FOREIGN PATENT DOCUMENTS

| | | | | | |
|---|---|---|---|---|---|
| JP | 202291549 | A | 6/2022 | | |
| WO | 2012160876 | A1 | 11/2012 | | |
| WO | 2014203862 | A2 | 12/2014 | | |
| WO | WO-2016148032 | A1 * | 9/2016 | .......... | G01R 33/093 |
| WO | 2018100778 | A1 | 6/2018 | | |
| WO | 2018159229 | A1 | 9/2018 | | |
| WO | WO-2022024610 | A1 * | 2/2022 | .......... | G01R 15/207 |

* cited by examiner

CURRENT SENSOR WITH INVERTED SHIELDING ELEMENT

CROSS-REFERENCE TO CORRESPONDING APPLICATIONS

This application claims the benefit of priority to, Chinese Patent Application No. 2022113366326, filed Oct. 28, 2022, entitled "CURRENT SENSOR WITH INVERTED SHIELDING ELEMENT," which application is incorporated herein by reference in its entirety.

FIELD OF THE DISCLOSURE

The disclosure relates generally to current sensors, more particularly, to a current sensor with inverted shielding.

BACKGROUND OF THE DISCLOSURE

Current sensors detect the current (voltage or temperature sensing for alternative selection) flowing through various vehicle systems, such as the battery charger system, battery system, power distribution system, inverter system, converter system, and others. Some current sensors use a single Hall IC, which provides an output signal proportional to the flux density applied horizontally. With increasing demands on density and miniaturization, improvements over existing current sensors are desired. It is with respect to these and other considerations that the present disclosures is provided.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one approach, a sensor device may include a housing, a substrate within the housing, and a sensing element coupled to the substrate. The sensor device may further include a shielding element surrounding the sensing element, wherein the shielding element extends through an opening of the substrate, and a busbar extending through the housing, wherein the shielding element further extends through an indentation along a first side of the busbar.

In another approach, a current sensor may include a printed circuit board (PCB) within a housing, a sensing element coupled to the PCB, and a shielding element surrounding the sensing element, wherein the shielding element extends through an opening of the PCB. The current sensor may further include a busbar extending through the housing, wherein the shielding element further extends through an indentation along a first side of the busbar.

In yet another approach, a current sensing device may include a printed circuit board (PCB) within a housing, a sensing element coupled to the PCB, and a busbar adjacent the PCB, the busbar extending through the housing. The current sensing device may further include a shielding element surrounding the sensing element, wherein the shielding element extends through an opening of the PCB and through an indentation along a first side of the busbar.

BRIEF DESCRIPTION OF THE DRAWINGS

The accompanying drawings illustrate exemplary approaches of the disclosed embodiments so far devised for the practical application of the principles thereof, and in which.

Figure 1:
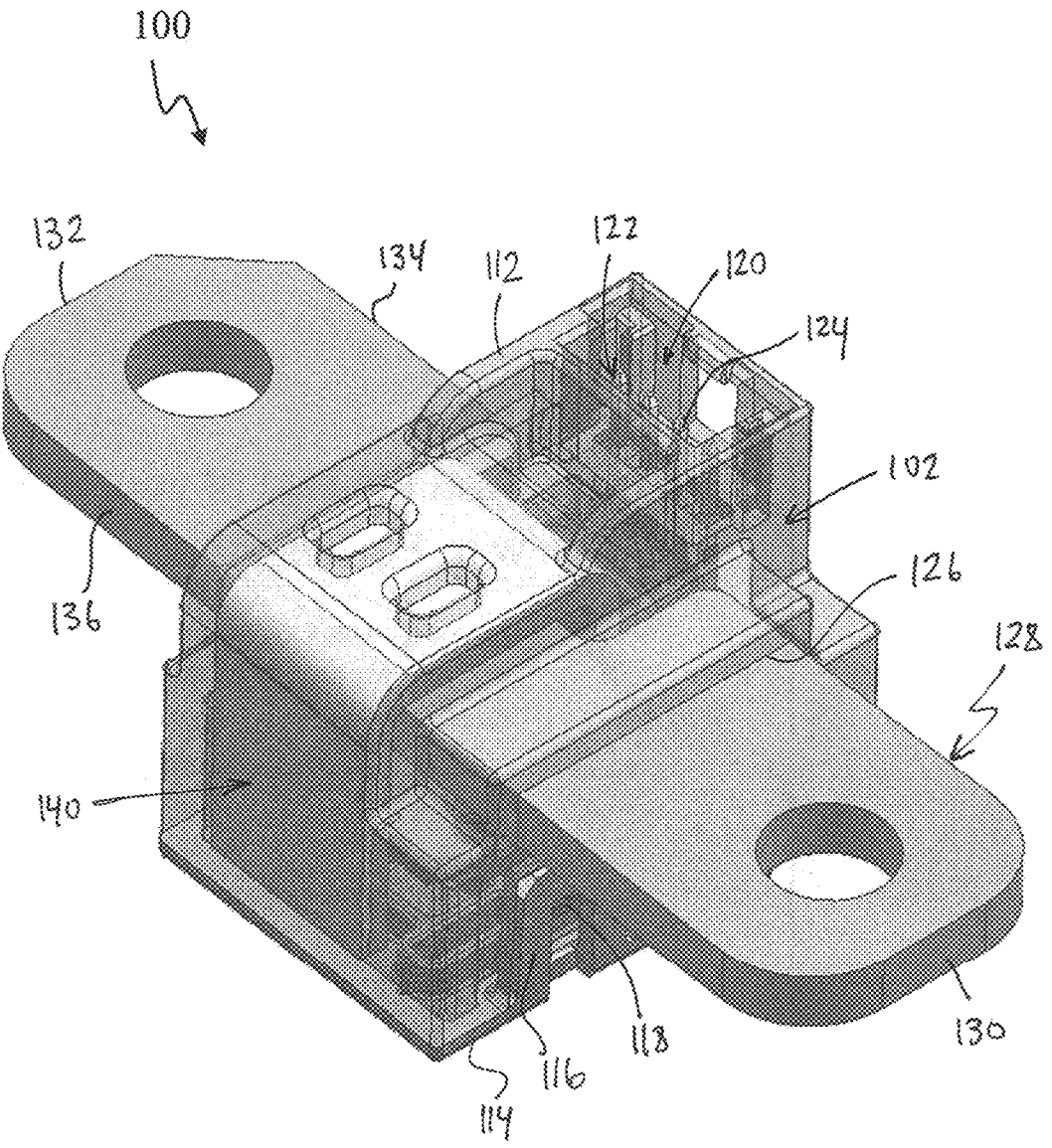
FIG. 1 is a perspective view of a sensing device according to embodiments of the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements. Furthermore, certain elements in some of the figures may be omitted, or illustrated not-to-scale, for illustrative clarity. Furthermore, for clarity, some reference numbers may be omitted in certain drawings.

DETAILED DESCRIPTION

Embodiments in accordance with the present disclosure will now be described more fully hereinafter with reference to the accompanying drawings. The aspects of the disclosure may be embodied in many different forms and should not be construed as being limited to the embodiments set forth herein. Rather, these embodiments are provided so that this disclosure will be thorough and complete, and will fully convey the scope of the system and method to those skilled in the art.

As will be described herein, provided are sensing devices including an inverted shielding element and slotted printed circuit board, which reduces an overall size of the sensing device while maintaining or improving sensing accuracy. In some embodiments, a sensing element of the sensing device may be a rotary and linear position ASIC, which supports multi-point calibration to increase sensor accuracy.

Figure 2:
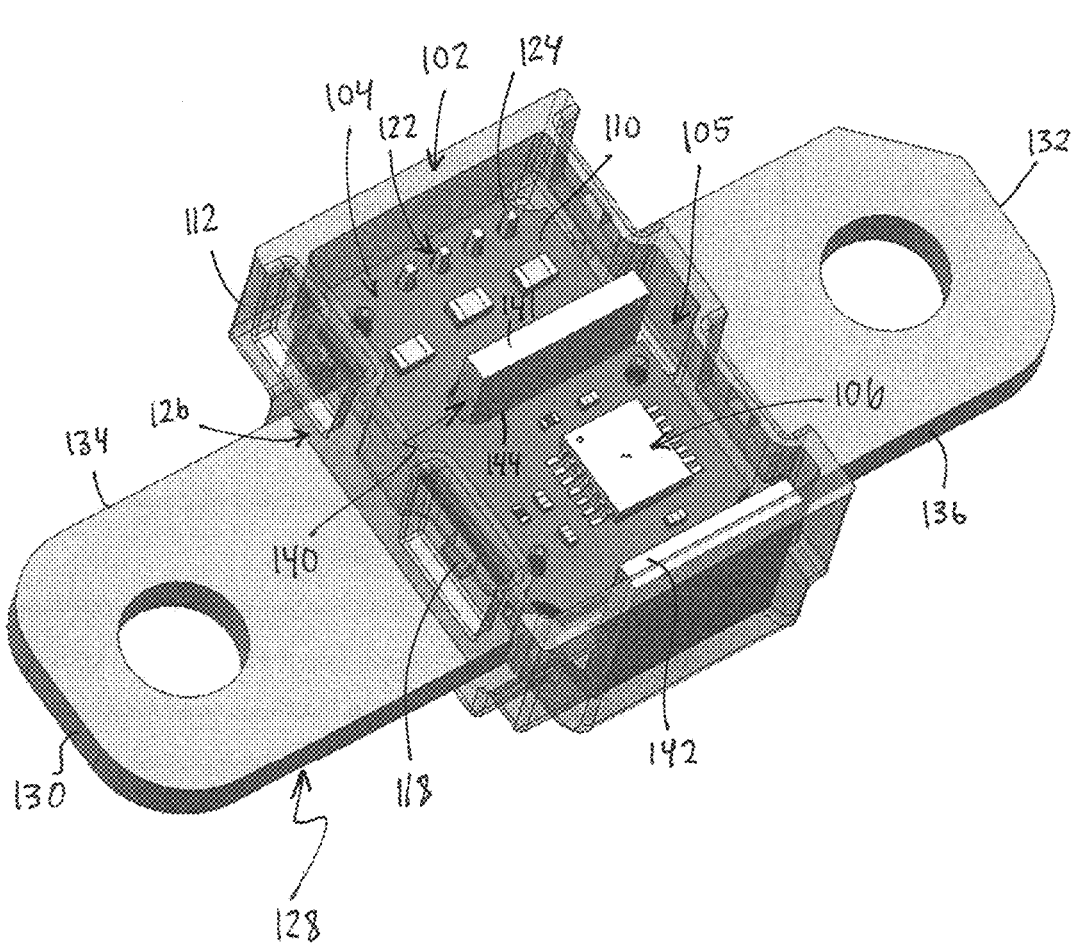
FIG. 2 is another perspective view of the sensing device according to embodiments of the present disclosure.
Figure 3:
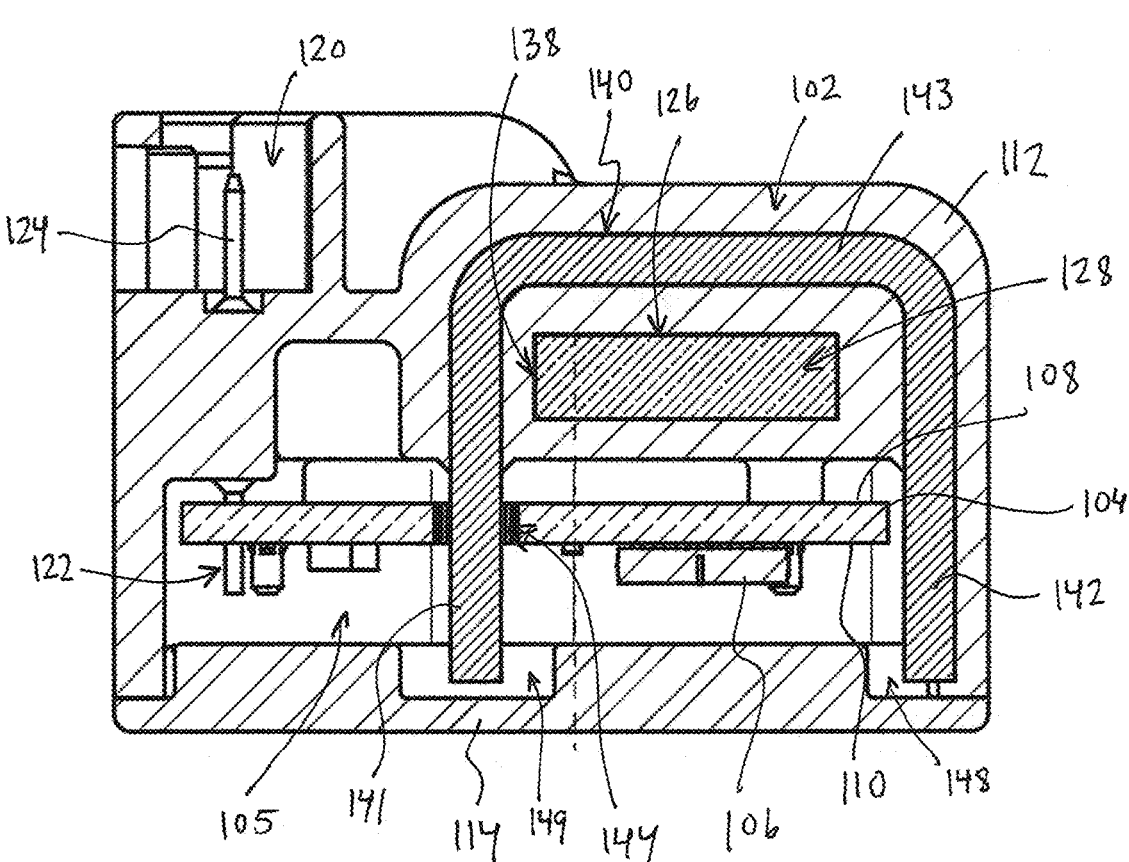
FIG. 3 is a cross sectional view of the sensing device, according to embodiments of the present disclosure.
Figure 4:
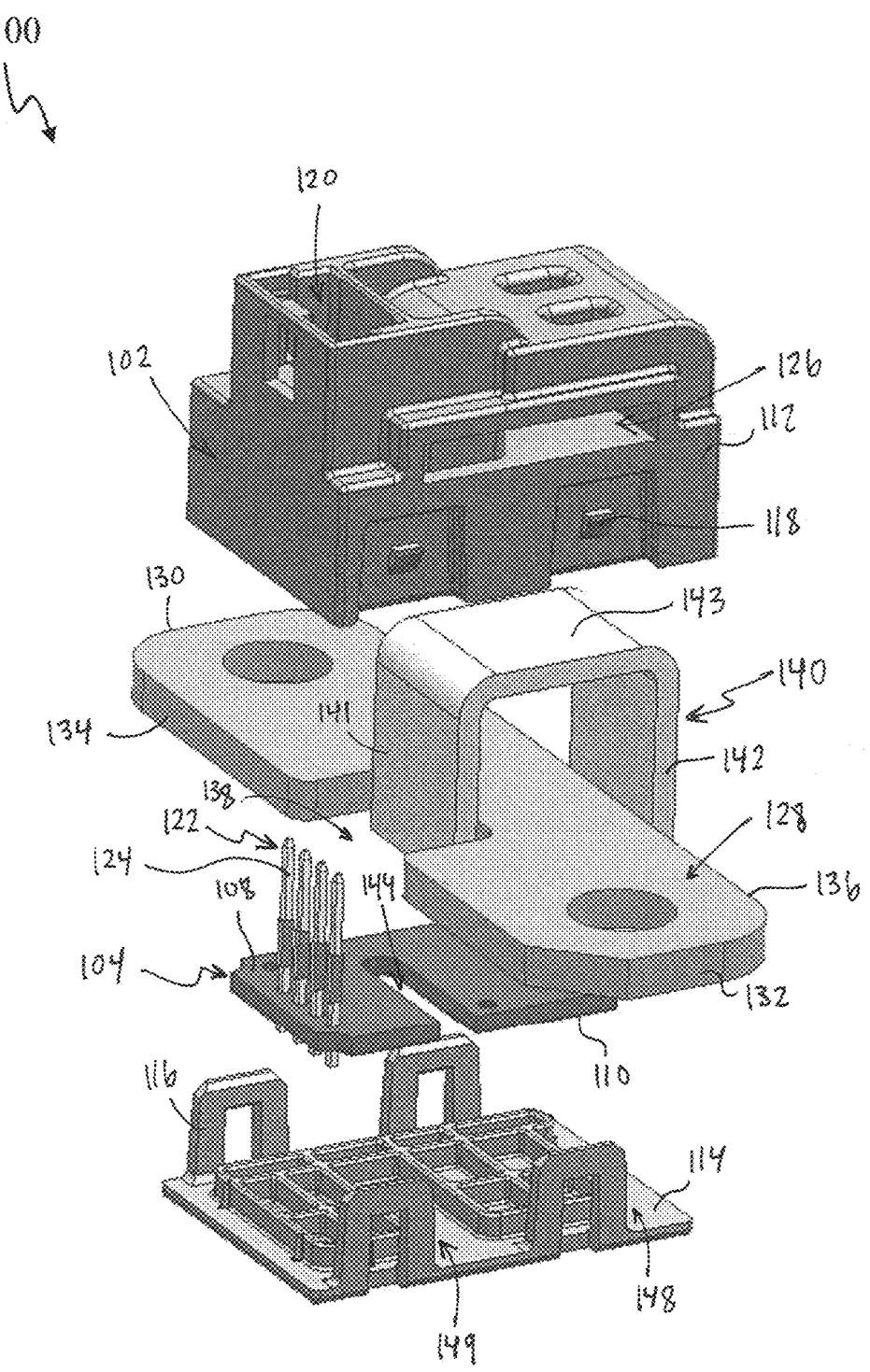
FIG. 4 is an exploded view of the sensing device, according to embodiments of the present disclosure.

Turning now to FIGS. 1-4, a sensing device (hereinafter "device") 100 according to embodiments of the present disclosure will be described. The device 100 may include a housing 102 enclosing a substrate 104 within an interior cavity 105, wherein a sensing element 106 is coupled to the substrate 104. Although non-limiting, the substrate 104 may be a printed circuit board (PCB) and the sensing element 106 may be a rotary and linear position Hall application-specific integrated circuit, or a current Hall application-specific integrated circuit. The substrate 104 may include a first main side 108 opposite a second main side 110. In various embodiments, the sensing element 106 may be attached to the first or second main sides 108, 110 of the substrate 104. Although not shown, the sensing element 106 may communicate with a processor or controller to determine the current level detected by the device 100.

In some embodiments, the housing 102 may be composed of a non-magnetic, or, more preferably, a non-metallic material, to prevent blocking of magnetic fields from reaching the sensing element 106. For example, the housing 102 could be composed of high-density polyethylene (HDPE) or a plastic (e.g., PA66+30GF). The present disclosure is not limited in this regard.

The housing 102 may include a main body 112 coupleable with a bottom cover 114, e.g., by a set of loop arms 116 and tabs 118. The main body 112 of the housing 102 may include a connector opening 120 operable to receive a plurality of pins 124 of a connector 122. The plurality of pins 124 may further extend through the substrate 104. It will be appreciated that the housing 102 may take on alternative shapes, configurations, number of components, etc., in other embodiments.

The main body 112 of the housing 102 may include a busbar opening 126 operable to receive a busbar 128 therein. The busbar 128 may include a first end 130 opposite a second end 132, and a first side 134 opposite a second side 136. As shown, the busbar 128 may be positioned along the first main side 108 of the substrate 102. Although non-limiting, the busbar 128 may be made from copper or other suitable material. As is common, the first end 130 and the second end 132 of the busbar 128 may extend outside of the housing 102.

Advantageously, the busbar 128 may include a recess or indentation 138 along the first side 134 to receive a shielding element 140 therein. The indentation 138 may generally be U-shaped or curved. In other embodiments, the indentation 138 is a slot, notch, or opening through the busbar 128. As better shown in FIGS. 3-4, the shielding element 140 may include first and second legs 141, 142 extending from a central portion 143 in an inverted U-shape configuration. The first leg 141 extends through the indentation 138 of the busbar 128 and through an opening 144 of the substrate 104. As shown, the opening 144 may extend from a side of the substrate 104, and may extend entirely between the first and second main sides 108, 110. The second leg 142 of the shielding element 140 wraps around the second side 136 of the busbar 128 and terminates within a slot 148 provided in the bottom cover 114 of the housing 102. The first leg 141 may similarly extend into a slot 149 of the bottom cover 114.

Although non-limiting, the shielding element 140 may be made from a material having a magnetic permeability property. For example, the shielding element 140 may be made from a magnetic shielding material, such as permalloy material (e.g., Fe—Ni alloy). Use of the magnetic shielding material isolates the interior cavity 105 proximate the sensing element 106 from interference that may be caused by external magnetic fields, and from concentrate magnetic fields between first and second legs 141, 142 of the shielding element 140. In another example, the shielding element 140 may be made of a conductive material (e.g., Fe—Si alloy).

By providing the shielding element 140 through the indentation 138 of the busbar 128 and through the opening 144 of the substrate 104, the device 100 may be made more compact without sacrificing performance of the sensing element 106.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A sensor device, comprising:
   a housing;
   a substrate within the housing;

a sensing element coupled to the substrate;

a shielding element surrounding the sensing element, wherein the shielding element extends through an opening of the substrate; and a busbar extending through the housing, wherein the shielding element further extends through an indentation formed in a first side of the busbar, wherein the shielding element comprises a single shielding member including a set of legs extending from a central portion in an inverted U-shape configuration, the central portion being positioned above the busbar and above the opening of the substrate, wherein a first leg of the set of legs extends downward from the central portion through the opening of the substrate and through the indentation formed in the first side of the busbar, wherein a second leg of the set of legs extends downward from the central portion on an opposite side of the busbar and wraps around a second side of the busbar, and wherein the first leg and the second leg of the shield element terminate within corresponding slots provided in a bottom cover of the housing.

2. The sensor device of claim 1, further comprising a connector passing through the substrate and through the housing.

3. The sensor device of claim 2, wherein the connector comprises a plurality of pins extending into a connector opening of the housing.

4. The sensor device of claim 1, wherein the substrate is a printed circuit board, and wherein the sensing element is a rotary and linear position Hall application-specific integrated circuit or a Hall current application-specific integrated circuit.

5. The sensor device of claim 1, wherein the busbar is positioned along a first main side of the substrate, and wherein the sensing element is coupled to a second main side of the substrate.

6. A current sensor, comprising:

a printed circuit board (PCB) within a housing, a sensing element coupled to the PCB;

a shielding element surrounding the sensing element, wherein the shielding element extends through an opening of the PCB; and a busbar extending through the housing, wherein the shielding element further extends through an indentation formed in a first side of the busbar, wherein the shielding element comprises a single shielding member including a set of legs extending from a central portion in an inverted U-shape configuration, the central portion being positioned above the busbar and above the opening of the PCB, wherein a first leg of the set of legs extends downward from the central portion through the opening of the PCB and through the indentation formed in the first side of the busbar, wherein a second leg of the set of legs extends downward from the central portion on an opposite side of the busbar and wraps around a second side of the busbar, and wherein the first leg and the second leg of the shield element terminate within corresponding slots provided in a bottom cover of the housing.

7. The current sensor of claim 6, further comprising a connector passing through the PCB and through the housing, wherein the connector comprises a plurality of pins extending into a connector opening of the housing.

8. The current sensor of claim 6, wherein the sensing element is a rotary and linear position Hall application-specific integrated circuit or a current Hall application-specific integrated circuit.

9. The current sensor of claim 6, wherein the busbar is positioned along a first main side of the PCB, and wherein the sensing element is coupled to a second main side of the PCB.

10. A current sensing device, comprising:

a printed circuit board (PCB) within a housing, a sensing element coupled to the PCB; a busbar adjacent the PCB, the busbar extending through the housing; and a shielding element surrounding the sensing element, wherein the shielding element extends through an opening of the PCB and through an indentation formed in a first side of the busbar, wherein the shielding element comprises a single shielding member including a set of legs extending from a central portion in an inverted U-shape configuration, the central portion being positioned above the busbar and above the opening of the PCB, wherein a first leg of the set of legs extends downward from the central portion through the opening of the PCB and through the indentation formed in the first side of the busbar, wherein a second leg of the set of legs extends downward from the central portion on an opposite side of the busbar and wraps around a second side of the busbar, wherein the first leg and the second leg extend to and terminate within slots provided in a bottom cover of the housing, and wherein the busbar is positioned along a first main side of the PCB and the sensing element is coupled to a second main side of the PCB.

11. The current sensing device of claim 10, further comprising a connector passing through the PCB and through the housing, wherein the connector comprises a plurality of pins extending into a connector opening of the PCB.

12. The current sensing device of claim 10, wherein the sensing element is a rotary and linear position Hall application-specific integrated circuit.

* * * * *